(12) United States Patent
Hammerschmidt et al.

(10) Patent No.: US 11,821,935 B2
(45) Date of Patent: Nov. 21, 2023

(54) DIFFERENTIAL AGING MONITOR CIRCUITS AND TECHNIQUES FOR ASSESSING AGING EFFECTS IN SEMICONDUCTOR CIRCUITS

(71) Applicant: Infineon Technologies AG, Neubiberg (DE)

(72) Inventors: Dirk Hammerschmidt, Villach (AT); Bernhard Gstoettenbauer, Engerwitzdorf (AT); Rafael Zalman, Markt Schwaben (DE); Thomas Zettler, Hoehenkirchen-Siegertsbrunn (DE); Georg Georgakos, Erding (DE); Ludwig Rossmeier, Dorfen (DE); Veit Kleeberger, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/457,207

(22) Filed: Dec. 1, 2021

(65) Prior Publication Data

US 2023/0168294 A1 Jun. 1, 2023

(51) Int. Cl.
*G01R 31/26* (2020.01)
*G01R 31/28* (2006.01)

(52) U.S. Cl.
CPC ..... *G01R 31/2642* (2013.01); *G01R 31/2815* (2013.01)

(58) Field of Classification Search
None
See application file for complete search history.

(56) References Cited

U.S. PATENT DOCUMENTS

| 9,465,373 | B2 | 10/2016 | Allen-Ware et al. |
| 10,250,029 | B2 | 4/2019 | Carletti et al. |
| 10,699,041 | B2 | 6/2020 | Hammerschmidt |
| 11,349,458 | B1* | 5/2022 | Ghosh ............... G01R 31/2621 |
| 2003/0023407 | A1 | 1/2003 | Loehr et al. |
| 2006/0209607 | A1* | 9/2006 | Menczigar ....... H03K 19/00384 365/207 |
| 2014/0068298 | A1 | 3/2014 | Simeral |

(Continued)

OTHER PUBLICATIONS

"Einfluss von Alterungseffekten auf die Robustheit digitaler Schaltungen", Retrieved from https://www.edacentrum.de/robust/de/content/zue/04_zue12-robust-tutorial-TUM.pdf, Retrieved on Sep. 15, 2021, 40 pp.

(Continued)

*Primary Examiner* — Patrick Assouad
*Assistant Examiner* — Haidong Zhang
(74) *Attorney, Agent, or Firm* — Shumaker & Sieffert, P.A.

(57) ABSTRACT

In some examples, this disclosure describes a method of operating a circuit. The method may comprise performing a circuit function under normal operating conditions, wherein performing the circuit function under the normal operating conditions includes performing at least a portion of the circuit functions via a characteristic circuit, performing at least the portion of the circuit function under enhanced stress conditions via a characteristic circuit replica, and predicting a potential future problem with the circuit function under the normal conditions based on an evaluation of operation of the characteristic circuit relative to operation of the characteristic circuit replica.

21 Claims, 7 Drawing Sheets

(56) References Cited

U.S. PATENT DOCUMENTS

| | | |
|---|---|---|
| 2014/0312873 A1 | 10/2014 | Raja et al. |
| 2015/0081044 A1 | 3/2015 | Allen-Ware et al. |
| 2016/0313719 A1 | 10/2016 | Sugiyama et al. |
| 2017/0146591 A1* | 5/2017 | Nobbe ............... H03H 7/38 |
| 2020/0104167 A1 | 4/2020 | Chen et al. |

OTHER PUBLICATIONS

Automotive Electronics Council, "Failure Mechanism Based Stress Test Qualification for Integrated Circuits", Automotive Electronics Council, Sep. 11, 2014, 48 pp.

IEC, "Reliability data handbook—Universal model for reliability prediction of electronics components, PCBs and equipment", International Electrotechnical Commission, First edition, Received on Sep. 15, 2021, 96 pp.

Jenkins et al., "On-chip circuit to monitor long-term NBTI and PBTI degradation," Microelectronics Reliability, ELSEVIER, accepted Jul. 10, 2013, 5 pp.

Ritter et al., "Aging sensors for on-chip metallization of integrated LDMOS transistors under cyclic thermo-mechanical stress," Microelectronics Reliability, ELSEVIER, accepted Jun. 6, 2017, 5 pp.

Ritter et al., "Resistance change in on-chip aluminum interconnects under cyclic thermo-mechanical stress," Microelectronics Reliability, ELSEVIER, Jun. 7, 2019, 5 pp.

U.S. Appl. No. 16/915,794, filed Jun. 29, 2021, naming inventors De Gasperi et al.

U.S. Appl. No. 17/457,166, filed Dec. 1, 2021, naming inventors Gstoettenbauer et al.

U.S. Appl. No. 17/457,183, filed Dec. 1, 2021, naming inventors Zettler et al.

U.S. Appl. No. 17/457,198, filed Dec. 1, 2021, naming inventors Rossmeier et al.

U.S. Appl. No. 17/457,216, filed Dec. 1, 2021, naming inventors Kleeberger et al.

U.S. Appl. No. 17/457,221, filed Dec. 1, 2021, naming inventors Georgakos et al.

* cited by examiner

DIFFERENTIAL AGING MONITOR CIRCUITS AND TECHNIQUES FOR ASSESSING AGING EFFECTS IN SEMICONDUCTOR CIRCUITS

TECHNICAL FIELD

This disclosure relates to semiconductor circuits, and more specifically, circuits and technique for assessing and managing semiconductor circuits during use.

BACKGROUND

Semiconductor circuits are used in a wide variety of circuit applications in order to perform any of a variety of circuit functions. Unfortunately, semiconductor circuits can degrade over time. For example, aging, environmental exposure, stress, or other conditions can lead to semiconductor degradation and possibly end-of life circuit failure, which is undesirable. The amount of stress conditions applied to semiconductor circuits strongly varies from case to case. As a result, the actual operational lifetime of a semiconductor circuit may be unpredictable.

In many situations, semiconductor circuits may be designed to tolerate an assumed worst-case mission profile during the lifetime of a system into which circuit will be installed (e.g., a vehicle). Only a small percentage of devices will actually be exposed to the worst-case mission profile. Consequently, many semiconductor circuits are overdesigned with respect to their actual mission profile, which can increase production costs associated with the semiconductor circuits. On the other hand, in unforeseeable exceptional cases, which may be caused be failures of within a larger system (e.g., a vehicle), even the worst-case mission profile can be exceeded and a circuit may reach its end-of-life earlier than expected, due to the excessive stress exposure. Such situations of excessive circuit life degradation may occur even if the circuit does not directly fail in the situation where the stress actually occurs. For vehicle circuits, examples for such exceptional erroneous conditions may include overheating of the engine due to loss of cooling fluid or massive electromagnetic exposure due to coupling between another faulty system component, which may cause high transients in a wiring harness.

SUMMARY

This disclosure describes techniques and circuits for assessing aging effects in circuits and predicting future problems in circuits before they occur. The described circuits and techniques may be used with a wide variety of circuits designed for a wide variety of different circuit functions. The techniques and circuits described in this disclosure may provide predictive alerts that can predict future circuit problems before they actually occur in functional circuits. In this way, system maintenance can be identified and performed (e.g., to replace functional circuits within a larger system) before they exhibit actual problems or failure. The circuits and techniques of this disclosure may promote safety and reliability in devices or systems, such as in a vehicle or a similar setting.

In one example, this disclosure describes a circuit comprising: a main function unit configured to perform a circuit function; a characteristic circuit that comprises at least a portion of the main function unit, wherein the characteristic circuit is configured to operate under normal operating conditions; a characteristic circuit replica that comprises a replica of the characteristic circuit, wherein the characteristic circuit replica is configured to operate under enhanced stress conditions; and an evaluation unit, wherein the evaluation unit is configured to evaluate operation of the characteristic circuit replica relative to operation of the characteristic circuit.

In another example, this disclosure describes a circuit comprising: a first circuit unit configured to perform a circuit function under normal operating conditions; a second circuit unit that is structurally similar to the first circuit unit, wherein the second circuit unit is configured to perform the circuit function under enhanced stress conditions; and a third circuit unit that is structurally similar to the first and second circuit units, wherein the third circuit unit is configured to perform the circuit function under normal or reduced stress conditions.

In another example, this disclosure describes a method of operating a circuit, the method comprising: performing a circuit function under normal operating conditions, wherein performing the circuit function under the normal operating conditions includes performing at least a portion of the circuit functions via a characteristic circuit; performing at least the portion of the circuit function under enhanced stress conditions via a characteristic circuit replica; and predicting a potential future problem with the circuit function under the normal conditions based on an evaluation of operation of the characteristic circuit replica relative to operation of the characteristic circuit replica.

The details of one or more examples are set forth in the accompanying drawings and the description below. Other features, objects, and advantages will be apparent from the description and drawings, and from the claims.

DETAILED DESCRIPTION

This disclosure describes techniques and circuits for assessing aging effects in circuits and for predicting future problems in circuits before the problems actually occur. This disclosure also describes techniques and circuits for promoting circuit safety and reliability. The described circuits and techniques may be used with a wide variety of circuits designed for a wide variety of different circuit functions. The circuits and techniques may promote safety and reliability in devices or systems, such as in a vehicle or a similar setting. Modern vehicles and other modern devices or systems may include a large number of functional circuits, and monitoring the health or operational safety of any of a wide variety of functional circuits is desirable to promote safety and reliability vehicles or other devices or systems.

The techniques and circuits described in this disclosure may provide predictive alerts that can predict circuit problems before they actually occur in a functional circuit that that is configured to perform a circuit function. In this way, system maintenance can be identified and performed (e.g., to replace a circuit in the system) before the circuit exhibits actual problems or failure. In some cases, the techniques and circuits of this disclosure for predicting future problems in a circuit may be used in combination with other techniques that detect or monitor for actual circuit problems that may currently exist. Accordingly, the techniques of this disclosure may generate system alerts in response to identifying actual existing problems with a functional circuit, and the techniques of this disclosure may also generate predictive system alerts to predict future problems with the functional circuit (e.g., to prompt anticipatory maintenance on the system).

Figure 1:
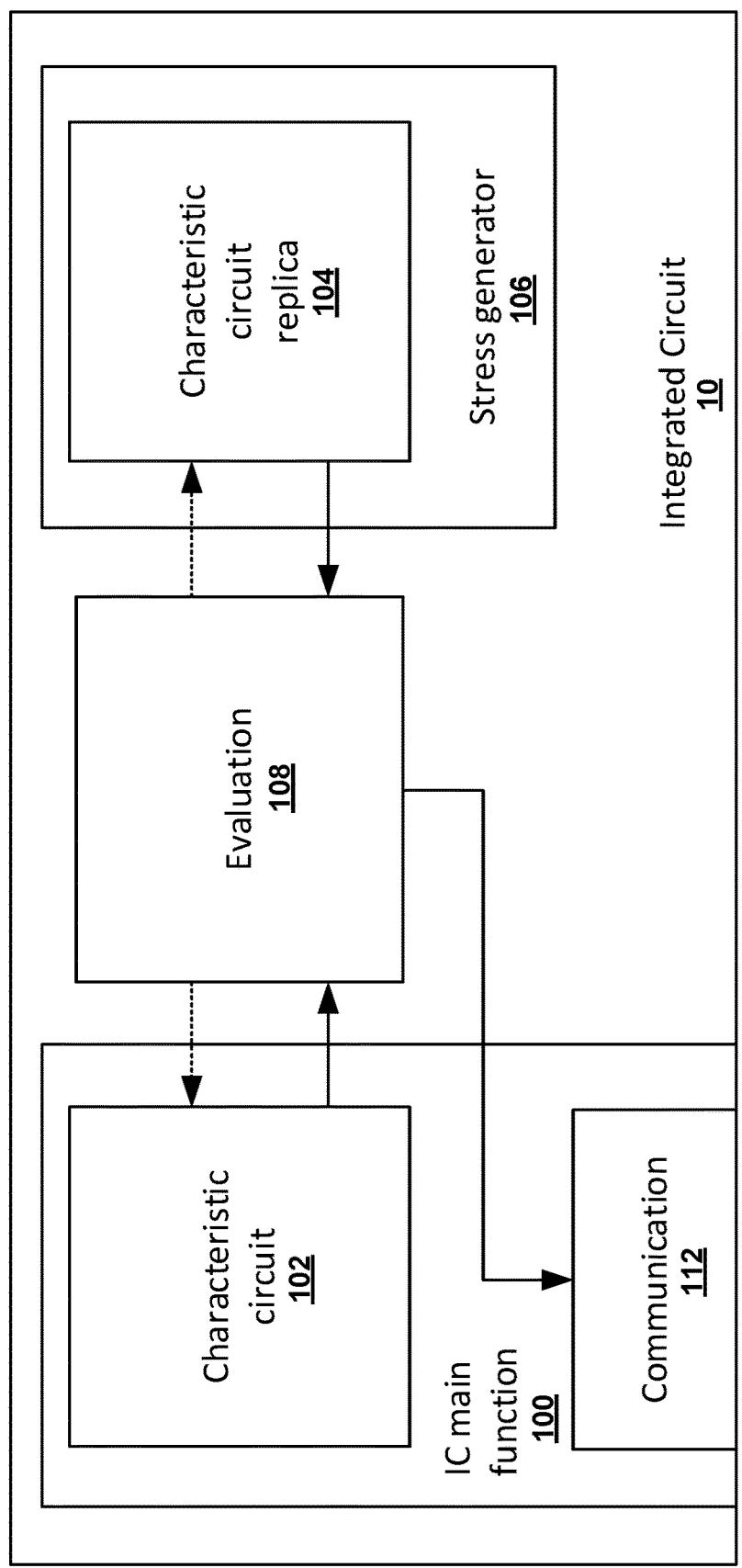
FIG. 1 is a block diagram showing a circuit according to an example of this disclosure.

FIG. 1 is a block diagram of an integrated circuit 10 that comprises a main function unit 100 configured to perform a circuit function. Main function unit 100 may comprise any of a wide variety of circuits used in a larger system. For example, main function unit 100 may comprise a driver circuit configured to drive a load. In another example, main function unit 100 may comprise a logic circuit configured to perform one or more logic functions. In another example, main function unit 100 may comprise a motor driver configured to drive a motor such as a multi-phase motor. In another example, main function unit 100 may comprise an oscillator circuit configured to generate an oscillating signal. In another example, main function unit 100 may comprise a level shifter circuit configured to shift or change the voltage level of a signal. In another example, main function unit 100 may comprise a phase shift circuit configured to shift the phase of a signal. In another example, main function unit 100 may comprise a phase locked loop circuit configured to provide an output signal having a phase that is based on the input signal. In another example, main function unit 100 may comprise an analog-to-digital converter (ADC) circuit configured to convert an analog signal to a digital signal. In another example, main function unit 100 may comprise a digital-to-analog converter (DAC) circuit configured to convert a digital signal to an analog signal. In another example, main function unit 100 may comprise an arithmetic logic unit (ALU) configured to perform an arithmetic function. In still other examples, main function unit 100 may comprise a processor, a microcontroller, a digital signal processor (DSP), a communication interface circuit such as a serial peripheral interface (SPI) or another type of communication interface circuit, a digital logic circuit, a state machine, a signal processing circuit, a control circuit, an analog function circuit, a memory circuit, a sensor, a sensor combined with at least a part of its readout and signal processing circuit, a communication interface or any other circuit configured to perform one or more circuit functions.

As shown in FIG. 1, a characteristic circuit 102 comprises at least a portion of the main function unit 100. For example, characteristic circuit 102 may itself be the main function unit 100 or characteristic circuit 102 may comprises a representative portion or part of main function circuit 100. In some cases, it is desirable for characteristic circuit 102 to comprise the entirety of main function unit 100, but in other cases, it is desirable for characteristic circuit 102 to comprise a mere portion of main function unit 100. Characteristic circuit 102 is configured to operate under normal operating conditions, which may include a normal operating temperature, a normal supply voltage, and/or under a normal load.

Integrated circuit 10 also includes a characteristic circuit replica 104 that comprises a replica of characteristic circuit 102. Thus, characteristic circuit replica 104 may comprise a replica of main function unit 100 or a replica of a portion of main function unit 100.

Characteristic circuit replica 104 is configured to operate under enhanced stress conditions. In other words, 104 is configured to receive or experience one or more enhanced stress conditions and operate one or more functions while experiencing the enhanced stress conditions. According to this disclosure, for example, enhanced stress conditions may include a higher operating temperature relative to a normal operating temperature, a higher supply voltage relative to a normal supply voltage, and/or an increased load relative to a normal load. Stress generator 106 may comprise one or more elements that create the enhanced stress conditions for characteristic circuit replica 104.

Integrated circuit 10 also includes an evaluation unit 108. Evaluation unit 108 may be configured to evaluate operation of characteristic circuit 102 relative to operation of the characteristic circuit replica 104. In some examples, evaluation unit 108 is configured to issue a predictive maintenance alert to identify a potential future problem with main function unit 100 based on the evaluation of operation of the characteristic circuit replica 104 relative to operation of the characteristic circuit 102. Integrated circuit 10 may further include a communication unit 112, which may be configured to communicate an indication of the predictive maintenance alert to another circuit, such as an ECU, a system-level microprocessor or any external system-level circuit. Based on the predictive maintenance alert, the system may schedule, suggest, or require maintenance on main function unit 100.

In some examples, the enhanced stress conditions applied to operation of characteristic circuit replica 104 comprise a higher temperature than a normal operating temperature associated with normal operating conditions. In this case, for example, stress generator 106 may comprise one or more local heaters positioned relative characteristic circuit replica 104 and configured to generate the higher temperature.

In some examples, the enhanced stress conditions applied to operation of characteristic circuit replica 104 comprise an increased supply voltage relative to a normal supply voltage associated with the normal operating conditions of characteristic circuit 102. In this case, for example, stress generator 106 may comprise one or more circuit elements configured to generate the increased supply voltage.

In some examples, the enhanced stress conditions applied to operation of characteristic circuit replica 104 comprise both a higher temperature than a normal temperature associated with normal operating conditions, and an increased supply voltage relative to a normal supply voltage associated with the normal operating conditions. In this case, stress generator 106 may include one or more local heaters positioned relative characteristic circuit replica 104 and one or more circuit elements configured to generate the increased supply voltage for characteristic circuit replica 104.

The use of one or more local heaters may depend on the circuit being operated with an increased supply voltage. If the circuit has low power consumption, e.g. a bandgap or a processing circuit operated with a low clock rate, increased self-heating due to the increased supply voltage may be negligible and additional heater elements may be desirable required. On the other hand, if the circuit exhibits high power consumption, e.g. an output driver or a digital circuit with high activity, the circuit may already have self-heating that locally heats the circuit over the surrounding temperature, in which case self-heating due to circuit operation may negate the need for local heaters to achieve the desired stress conditions. Thus, in some examples, if a supply voltage a high power circuit is increased, for example, the resulting increase of power consumption may already be sufficient to generate increased temperature stress without additional local heater elements.

In some examples, the enhanced stress conditions applied to operation of characteristic circuit replica 104 comprise an increased load relative to a normal load associated with normal operating conditions of characteristic circuit 102. In this case, stress generator 106 may include one or more resistors or other elements configured to create the increased load.

As mentioned above, in some cases, it is desirable for characteristic circuit 102 to comprise the entirety of main function unit 100, but in other cases, it is desirable for characteristic circuit 102 to comprise a mere portion of main function unit 100. In some examples, a part of main function unit 100 may be sufficiently characteristic for the whole operation performed by main function unit 100, in which case, characteristic circuit 102 may that part of main function unit 100 that is sufficiently characteristic for the whole operation performed by main function unit 100. Characteristic circuit replica 104, in this example may be a copy of that portion of main function unit 100 that characteristic circuit 102, with similar inputs and outputs. In some examples, main function unit 100 may comprise an angle sensor, and characteristic circuit 102 and characteristic circuit replica 104 may comprises a coordinate rotation digital computer (CORDIC) of an angle sensor. In another example, main function unit 100 may comprise an ADC, and characteristic circuit 102 and characteristic circuit replica 104 may comprises some or all of the ADC. In another example, main function unit 100 may comprise a load driver circuit configured to drive a load, and characteristic circuit 102 and characteristic circuit replica 104 may comprise the load output driver circuit or a smaller portion of the load driver circuit. The output results of characteristic circuit 102 can be monitored by evaluation unit 108 relative to the output results of characteristic circuit replica 104.

Characteristic circuit 102 may receive normal inputs in a normal environment (e.g., a normal supply voltage in a normal operating temperature). In contrast, characteristic circuit replica 104 may receive more stressful inputs (e.g., an elevated supply voltage, possibly at an elevated operating temperature). These different inputs and enhanced stress in characteristic circuit replica 104 may cause characteristic circuit replica 104 to exhibit accelerated aging relative to characteristic circuit 102. More generally, these enhanced stress conditions applied to characteristic circuit replica 104 by stress generator 106 may comprise an increased temperature caused by a local heater, an increased supply voltage, an increased load condition, other stress factors or enhanced stress conditions, or combinations of these factors and conditions. Once evaluation unit 106 detects a potential future problem with main function unit 100 based on differences in operation of characteristic circuit 102 relative to operation of characteristic circuit replica 104, communication unit 112 can send an alert. A larger system may then recommend or require remedial action, such as replacement of circuit 10 within the larger system.

In some examples, in special cases, no explicit stress generation elements may be required since the stress in different locations of a chip may be different already. In this type of situation, the operational characteristic circuit may be located in a circuit region with higher stress and a replica characteristic circuit may be located in a region that experiences the lower stress. For example, this situation could occur within a die having a local heat source like a linear voltage regulator or a power output stage in which proximity to a higher die temperature exists without any additional stress-creating elements.

Figure 2:
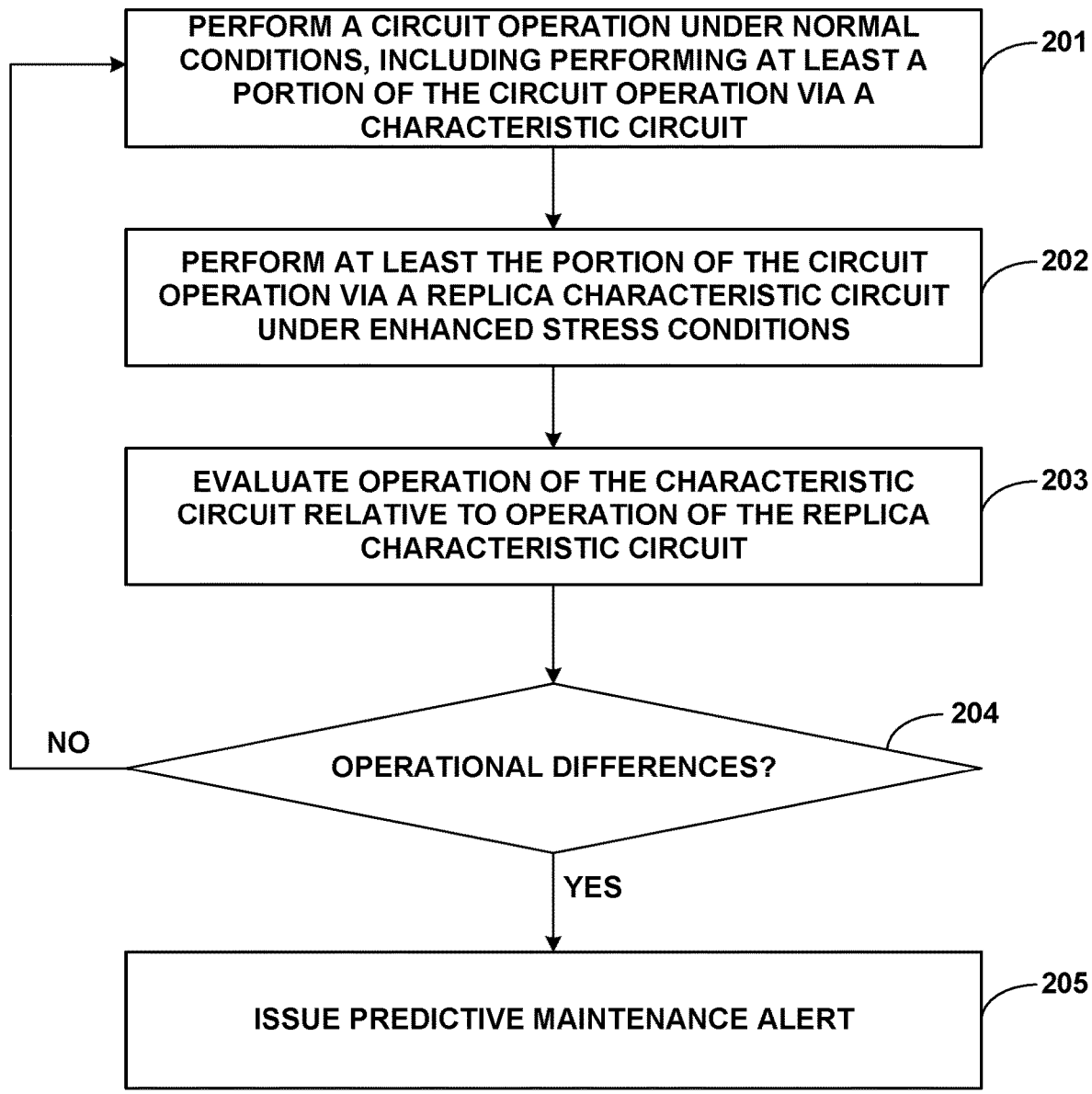
FIG. 2 is a flow diagram showing operation of a circuit according to an example of this disclosure.

FIG. 2 is a flow diagram showing operation of a circuit according to an example of this disclosure. FIG. 2 will be described from the perspective of integrated circuit 10 shown in FIG. 1, although other circuits or devices may perform the method. As shown in FIG. 2, a main function unit 100 performs a circuit function under normal operating conditions (201). Performing the circuit function under normal operating conditions includes performing at least a portion of the circuit functions via a characteristic circuit 102 (201). Again, characteristic circuit 102 which may comprise a representative portion of main function unit 100 or the entirety of main function unit 100.

Characteristic circuit replica 104 performs at least the portion of the circuit function under enhanced stress conditions (202). According to this disclosure, circuit 10 can be configured to predict a potential future problem with the circuit function under the normal conditions based on an evaluation of operation of characteristic circuit 102 relative to operation of the characteristic circuit replica 104. For example, as shown in FIG. 2, evaluation unit 108 may evaluate operation of characteristic circuit replica 104 relative to operation of the characteristic circuit 104 (203) to determine whether there are operational differences (204). Operational differences, for example, may comprise different outputs that are outside of a tolerance or different measured operational parameters (e.g., voltages or currents) that are outside of a tolerance. Operational differences, in some cases, may include determining that characteristic circuit replica 104 is operating with one or more circuit parameters that are outside of an acceptable specification of such circuit parameters for characteristic circuit 102. Furthermore, in case of a digital processing circuit (e.g. controller core, Cordic, Filter) the comparison can also be used to demonstrate a fully synchronous operation with identical results (e.g., similar to a lock step core).

In response to evaluation unit 108 identifying operational differences in the operation of characteristic circuit replica 104 relative to operation of the characteristic circuit 102 (yes branch of 204), communication unit 112 may be configured to issue a predictive maintenance alert to another device or circuit within a larger system. The alert is a predictive maintenance alert insofar as it may predict future issues or problems with characteristic circuit 102 based on current issues or problems identified in characteristic circuit replica 104 and imply that maintenance is needed on main function unit 100. In some examples, communication unit 112 may be configured to issue a predictive maintenance alert to another circuit, such as an ECU, a system-level microprocessor or any external system-level circuit. Based on the predictive maintenance alert, the system may then schedule, suggest, or require maintenance on main function unit 100.

In some examples, by using a critical part of circuitry within a main function unit 100 as a characteristic circuit 102 to functionality of main function unit 100, replicating this circuitry as characteristic circuit replica 104, and evaluating operation of characteristic circuit 102 and characteristic circuit replica 104, predictive maintenance can be identified before circuit problems or failure occur in main function unit 100.

In some examples, characteristic circuit 102 may comprise part of a signal path (e.g. ADC with filters), or a computer core, or a power driver stage (possibly scaled down to safe area). characteristic circuit 102 can be selected, copied and operated as characteristic circuit replica 104 synchronously with characteristic circuit 102, e.g., with the same inputs and outputs. Characteristic circuit replica 104 may be exposed to operation conditions that cause a slightly faster aging process in characteristic circuit replica 104 relative to characteristic circuit 102. Consequently, characteristic circuit replica 104 may age faster than characteristic circuit 102. In some examples, characteristic circuit replica 104 is monitored to determine if it stays within its specifications or characteristic circuit replica 104 can be compared with characteristic circuit 102 (which experiences lower stress) to determine if differences in circuit operation are tolerable.

The increase of aging due to an increase of supply voltage or temperature can be predicted by reliability models, and can thus, in some cases, can be dimensioned in a way that the detection of possible issues appears at a certain percentage of the real life time of a given circuit (e.g. 80% or 90% of expected circuit life). In some examples, additional margin can be included to cover mismatches between the different instances of the characteristic circuit replica 104.

Figure 3:
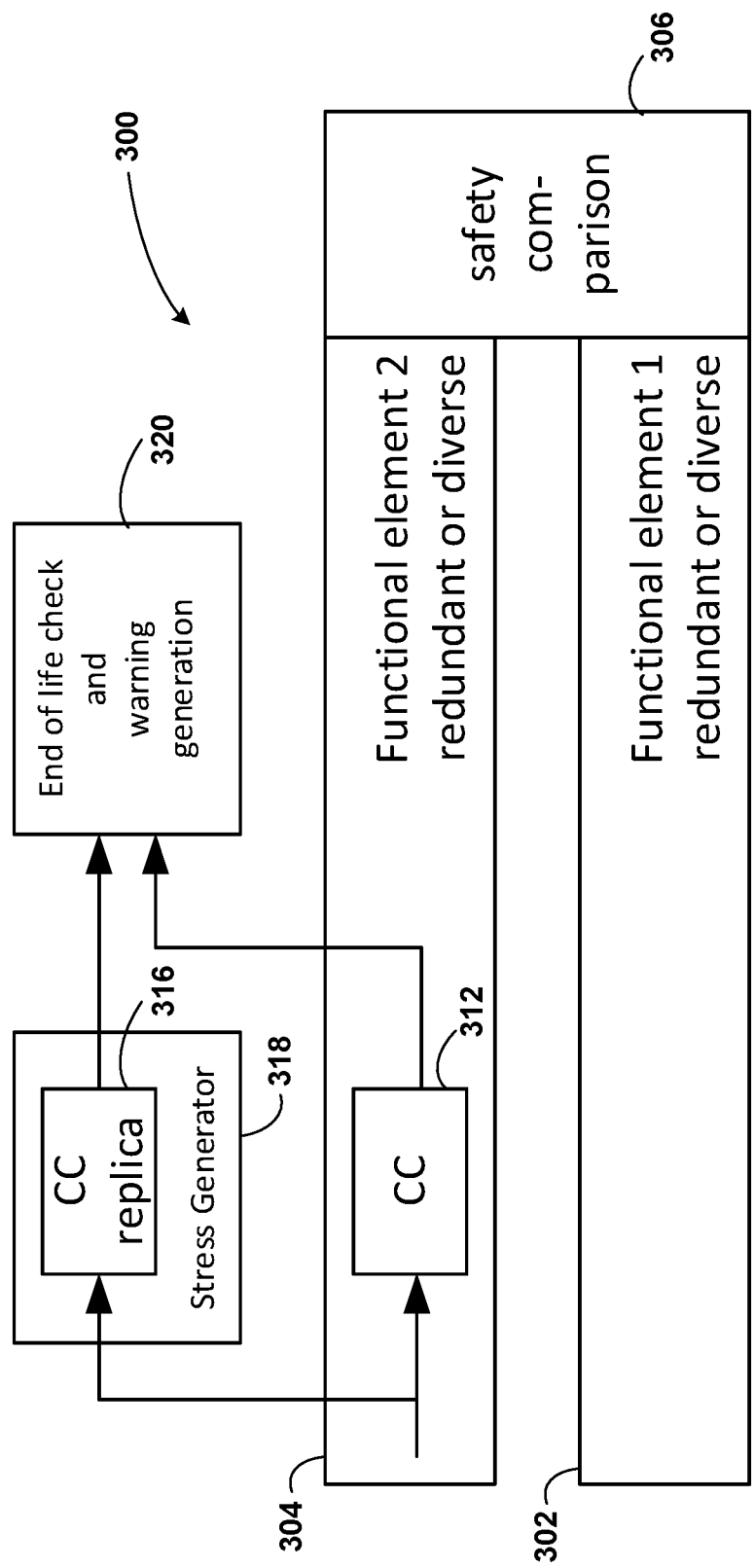
FIG. 3 is another block diagram showing a circuit according to an example of this disclosure.

FIG. 3 is another block diagram showing a circuit 300 according to an example of this disclosure. In this example, circuit 300 may comprise a redundant circuit built with redundancy for safety purposes. In particular, circuit 300 may comprise a first functional element 302 and a second functional element 304. First functional element 302 and second functional element 304 may be redundant or diverse relative to one another in order to promote safety within a larger system, such as an automobile or other vehicle.

First functional element 302 may comprise a function unit that is configured to operate similarly to second functional element 304, and vice versa. A safety comparison unit 306 may be configured to compare operation of first functional element 302 and second functional element 304. In response to identifying a possible functional safety issue based on comparing operation of first functional element 302 and second functional element 304, safety comparison unit 306 may issue an alert or cause remedial action, such as disabling one or more components of a larger system, disabling functional elements 302 and 304, or other remedial action that promotes safety. In some examples, safety comparison unit 306 may be configured to issue a safety alert in response to first functional element 302 operating differently than second functional element 304. Moreover, in some examples, safety comparison unit 306 may be configured disable at least a portion of circuit 300 in response to first functional element 302 operating differently than second functional element 304.

In some examples, first functional element 302 can be viewed as a first main function unit (similar to main function unit 100 of FIG. 1). Moreover, second functional element 304 can be viewed as second main function unit (also similar to main function unit 100 of FIG. 1).

For example, first functional element 302 and second functional element 304 may each comprise a driver circuit, a logic circuit, a motor driver, an oscillator circuit, a level shifter circuit, a phase shift circuit, a phase locked loop circuit, an ADC circuit, a DAC circuit, an ALU, a processor, a microcontroller, a DSP, a communication interface circuit such as an SPI or another type of communication interface circuit, a digital logic circuit, a state machine, a signal processing circuit, a control circuit, an analog function circuit, a memory circuit, a sensor, or any other circuit configured to perform one or more circuit functions.

As shown in FIG. 3, a characteristic circuit 312 comprises at least a portion of the second functional element 304. Characteristic circuit 312 may itself be second functional element 304 or characteristic circuit 312 may comprises a representative portion or part of second functional element 304. Characteristic circuit 312 is configured to operate under normal operating conditions, which may include a normal operating temperature, a normal supply voltage, and/or under a normal load.

Circuit 300 also includes a characteristic circuit replica 316 that comprises a replica of characteristic circuit 312. Characteristic circuit replica 316 is configured to operate under enhanced stress conditions, which according to this disclosure may include such things as a higher operating temperature relative to a normal operating temperature, a higher supply voltage relative to a normal supply voltage, and/or an increased load relative to a normal load. Stress generator 318 may comprise one or more elements that create the enhanced stress conditions for characteristic circuit replica 318.

Circuit 300 also includes an end-of-life check and warning generation unit 320. In some examples, unit 320 is configured to evaluate operation of characteristic circuit 312 relative to operation of the characteristic circuit replica 316. In some examples, unit 320 is configured to issue a predictive maintenance alert to identify a potential future problem with first and second functional elements 302 and 304 based on the evaluation of operation of the characteristic circuit replica 318 relative to operation of the characteristic circuit 316. Unit 320, for example, may be configured to communicate an indication of the predictive maintenance alert to another circuit, such as an ECU, a system-level microprocessor or any external system-level circuit. Based on the predictive maintenance alert, a larger system may schedule, suggest, or require maintenance on first and second functional elements 302 and 304, e.g., before any actual safety issues are identified by safety comparison unit 306.

In some examples, unit 320 may be configured to determine whether characteristic circuit replica 318 is operating with one or more circuit parameters that are outside of an acceptable specification of such circuit parameters for characteristic circuit 312. If so, unit 320 may issue a predictive maintenance alert to identify a potential future problem with first and second functional elements 302 and 304.

As with the examples above, the enhanced stress conditions applied to operation of characteristic circuit replica 316 may comprise a higher temperature than a normal operating temperature associated with normal operating conditions of characteristic circuit 312. In this case, for example, stress generator 318 may comprise one or more local heaters positioned relative characteristic circuit replica 316 and configured to generate the higher temperature.

In some examples, the enhanced stress conditions applied to operation of characteristic circuit replica 316 comprise an increased supply voltage relative to a normal supply voltage associated with the normal operating conditions of characteristic circuit 312. In this case, for example, stress generator 318 may comprise one or more circuit elements configured to generate the increased supply voltage.

In some examples, the enhanced stress conditions applied to operation of characteristic circuit replica 316 comprise both a higher temperature than a normal temperature associated with normal operating conditions, and an increased supply voltage relative to a normal supply voltage associated with the normal operating conditions of characteristic circuit 312. In this case, stress generator 318 may include one or more local heaters positioned relative characteristic circuit replica 312 and one or more circuit elements configured to generate the increased supply voltage for characteristic circuit replica 312.

In some examples, the enhanced stress conditions applied to operation of characteristic circuit replica 316 comprise an increased load relative to a normal load associated with normal operating conditions of characteristic circuit 312 or functional element 304. In this case, stress generator 318 may include one or more resistors or other elements configured to create the increased load.

Figure 4:
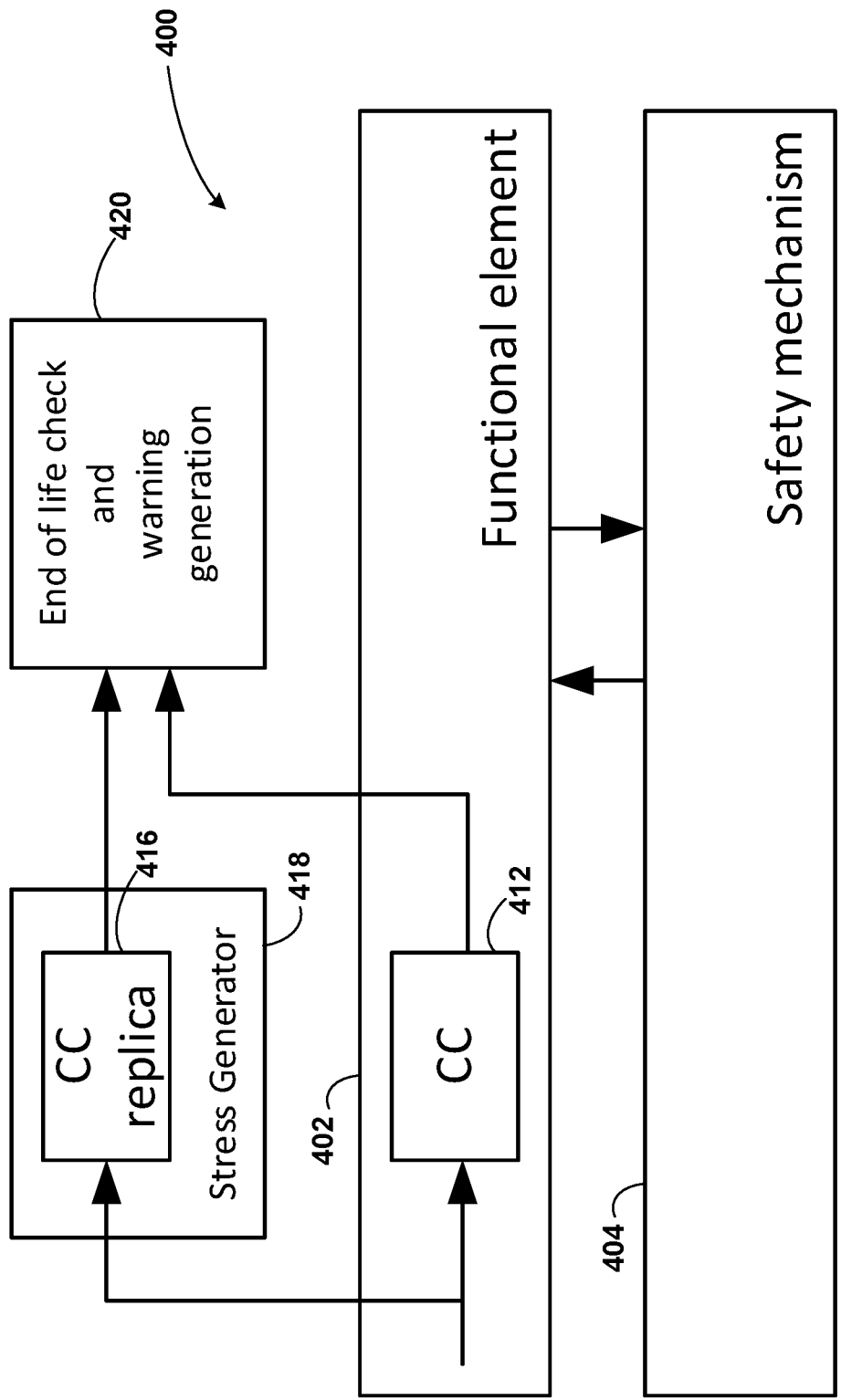
FIG. 4 is another block diagram showing a circuit according to an example of this disclosure.

FIG. 4 is another block diagram showing a circuit 400 according to an example of this disclosure. In this example, circuit 400 may comprise a functional element 402 along with a safety mechanism unit 404 that is configured to promote safety associated with operation of functional element 402 within a larger system, such as an automobile or other vehicle. Safety mechanism unit 404, for example, may be configured monitor output of functional element 402 or one or more operational parameters of functional element 402.

In response to identifying a possible functional safety issue associated with functional element 402, safety mechanism unit 404 may generate one or more safety signals, issue an alert, or cause remedial action, such as disabling one or more components of a larger system, disabling functional element 402, or other remedial action that promotes safety. In some examples, safety mechanism unit 404 is configured to output a safety alert in response to identifying an undesirable operation of functional element 402. In some examples, safety mechanism unit 404 is configured to disable at least a portion of circuit 400 in response to identifying an undesirable operation of the functional element 402.

In some examples, functional element 402 can be viewed as being similar to main function unit 100 of FIG. 1, which is described in detail above. For example, functional element 402 may comprise a driver circuit, a logic circuit, a motor driver, an oscillator circuit, a level shifter circuit, a phase shift circuit, a phase locked loop circuit, an ADC circuit, a DAC circuit, an ALU, a processor, a microcontroller, a DSP, a sensor circuit, a communication interface circuit such as an SPI or another type of communication interface circuit, a digital logic circuit, a state machine, a signal processing circuit, a control circuit, an analog function circuit, a memory circuit, or any other circuit configured to perform one or more circuit functions.

Similar to other examples above, as shown in FIG. 4, a characteristic circuit 412 comprises at least a portion of the functional element 402. Characteristic circuit 412 may itself be functional element 402 or characteristic circuit 412 may comprises a representative portion or part of functional element 402. Characteristic circuit 412 is configured to operate under normal operating conditions, which may include a normal operating temperature, a normal supply voltage, and/or under a normal load.

Circuit 400 also includes a characteristic circuit replica 416 that comprises a replica of characteristic circuit 412. Characteristic circuit replica 416 is configured to operate under enhanced stress conditions, which according to this disclosure may include such things as a higher operating temperature relative to a normal operating temperature, a higher supply voltage relative to a normal supply voltage, and/or an increased load relative to a normal load. Stress generator 418 may comprise one or more elements that create the enhanced stress conditions for characteristic circuit replica 418.

Circuit 400 also includes an end-of-life check and warning generation unit 420. In some examples, unit 420 is configured to evaluate operation of characteristic circuit 412 relative to operation of the characteristic circuit replica 416. In some examples, unit 420 is configured to issue a predictive maintenance alert to identify a potential future problem with functional element 402 based on the evaluation of operation of the characteristic circuit replica 418, or based on evaluation of operation of the characteristic circuit replica 418 relative to operation of the characteristic circuit 416. Unit 420, for example, may be configured to communicate an indication of the predictive maintenance alert to another circuit, such as an ECU, a system-level microprocessor or any external system-level circuit. Based on the predictive maintenance alert, a larger system may schedule, suggest, or require maintenance on functional element 402, e.g., before any actual safety issues are identified by safety mechanism 404.

In some examples, unit 420 may be configured to determine whether characteristic circuit replica 418 is operating with one or more circuit parameters that are outside of an acceptable specification of such circuit parameters for characteristic circuit 412. If so, unit 420 may issue a predictive maintenance alert to identify a potential future problem with functional element 402.

As with the examples above, the enhanced stress conditions applied to operation of characteristic circuit replica 416 may comprise a higher temperature than a normal operating temperature associated with normal operating conditions of characteristic circuit 412, an increased supply voltage relative to a normal supply voltage associated with the normal operating conditions of characteristic circuit 412, both a higher temperature than a normal temperature associated with normal operating conditions, and an increased supply voltage relative to a normal supply voltage associated with the normal operating conditions of characteristic circuit 412, an increased load relative to a normal load associated with normal operating conditions of characteristic circuit 412 or functional element 402, or stress conditions or combinations of stress conditions. In any case, stress generator 418 may elements needed to create the enhanced stress conditions.

FIGS. 3 and 4 may demonstrate that functional safety concerns may be separate and independent of end-of-life analysis or predictive maintenance for circuits. The functional safety may be assured by redundancy or diversity or via a a safety mechanism. In some examples, efforts can be made to limit the size of a characteristic circuit, so that it may be a relatively small part of a functional element or functional unit. However, in some cases, a desirable aging prognosis can be given based on a complete copy of the functional element, i.e., in which case the characteristic circuit may comprise the entirety of the functional element and the characteristic circuit replica may comprise a replica of the entire of the functional element that operates under the enhanced stress conditions.

This disclosure also contemplates several possible implementation examples for an end of live checks, which may be performed by evaluation unit 108, end-of-life and warning generation unit 320, or end-of-life and warning generation unit 420. In some examples, for a characteristic circuit that generates continuous values (e.g., analogue or mixed signal or digital filter) the deviation between the characteristic circuit and the characteristic circuit replica should not exceed a specified tolerance or should decay back into the tolerance range within a specified time window. In some examples, for a characteristic circuit that includes digital processing block outputs, such outputs may need to exactly equal for identical inputs. For temporary deviations (e.g., soft errors) a comparison error may be tolerated, in some examples, if it does not re-occur after resetting both the characteristic circuit and the replica characteristic circuit. A tolerable comparison error rate may also be accepted, in some examples. These and other types analysis or determinations may be performed by evaluation unit 108, end-of-life and warning generation unit 320, or end-of-life and warning generation unit 420.

Figure 5:
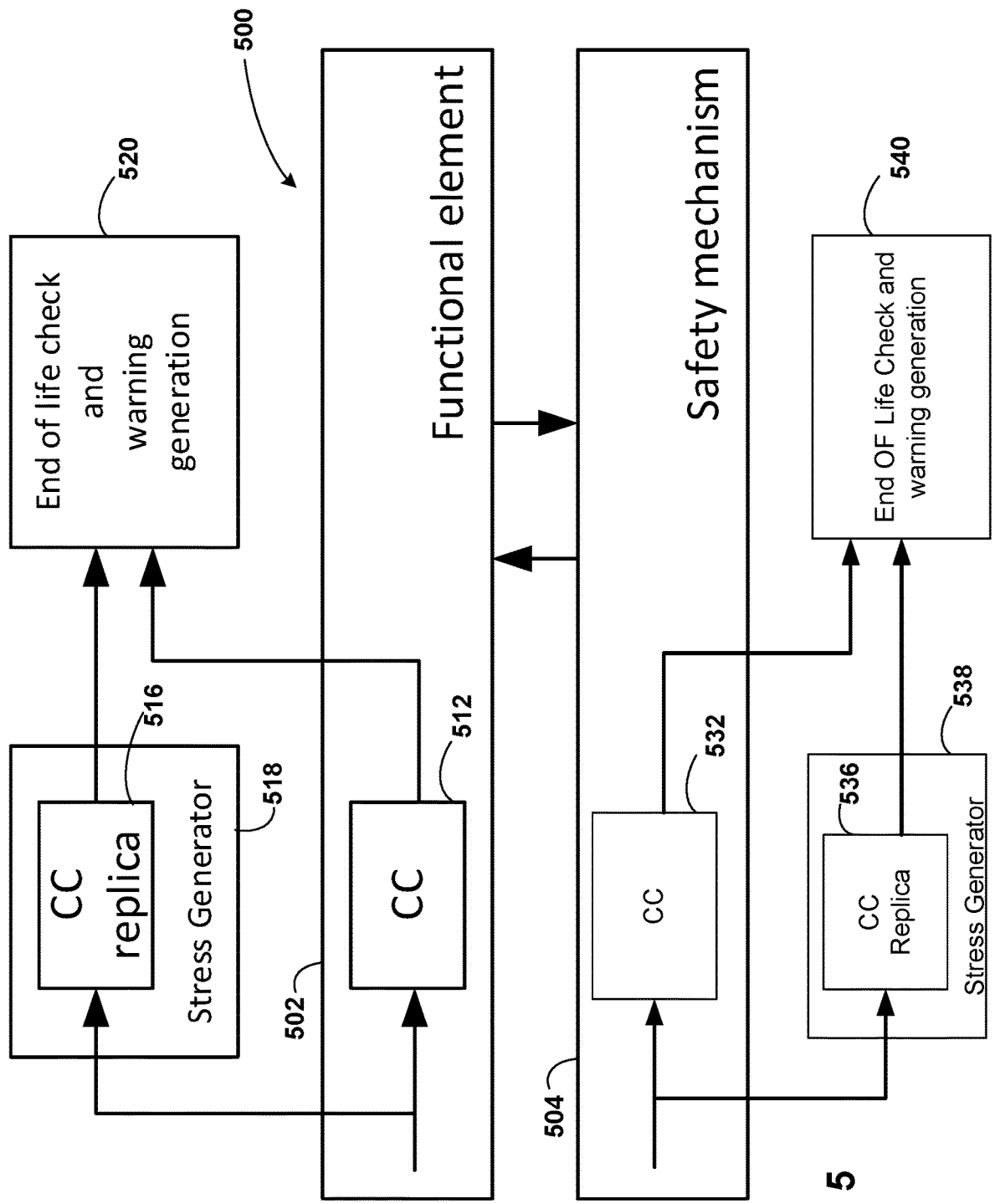
FIG. 5 is another block diagram showing a circuit according to an example of this disclosure.

FIG. 5 is another block diagram showing a circuit 500 according to an example of this disclosure. FIG. 5 is very similar to FIG. 4 in many respects, and therefore, many of the details of FIG. 5 will not be explained again insofar as they are similar to those of FIG. 4. Functional element 502 is similar to functional element 402 of FIG. 4. Characteristic circuit 512 and characteristic circuit replica 516 are similar to characteristic circuit 412 and characteristic circuit replica 416 of FIG. 4. Stress generator 518 is similar to stress generator 418 of FIG. 4. End-of-life and warning generation unit 520 is similar to end-of-life and warning generation unit 420 of FIG. 4.

Safety mechanism 504 may operate similarly to safety mechanism 404 of FIG. 4. In addition, safety mechanism 504 may include circuit features of this disclosure for predicting end-of-life prior to circuit failure, and for initiating predictive maintenance on safety mechanism 504 before problems (e.g., aging problems) manifest in safety mechanism 504.

Thus, as shown in FIG. 5, a characteristic circuit 532, a characteristic circuit replica 536 that operates under enhanced stress conditions from stress generator 538, and an end-of life check and warning generation unit 540 are all associated with safety mechanism 504.

Similar to other examples above, characteristic circuit 532 comprises at least a portion of the safety mechanism 532, e.g., the entirety of safety mechanism 504 or a representative portion or part of safety mechanism 504. Characteristic circuit 532 is configured to operate under normal operating conditions, which may include a normal operating temperature, a normal supply voltage, and/or under a normal load associated with safety mechanism 504.

Circuit 500 also includes a characteristic circuit replica 536 that comprises a replica of characteristic circuit 532. As with other examples, characteristic circuit replica 536 is configured to operate under enhanced stress conditions, which according to this disclosure may include such things as a higher operating temperature relative to a normal operating temperature, a higher supply voltage relative to a normal supply voltage, and/or an increased load relative to a normal load. Stress generator 538 may comprise one or more elements that create the enhanced stress conditions for characteristic circuit replica 536.

Circuit 500 also includes an end-of-life check and warning generation unit 540 associated with safety mechanism 504. Unit 540 may be configured to evaluate operation of characteristic circuit 532 relative to operation of the characteristic circuit replica 536. Unit 540 may be configured to issue a predictive maintenance alert to identify a potential future problem with safety mechanism 504 based on the evaluation of operation of the characteristic circuit replica 536, or based on evaluation of operation of the characteristic circuit replica 536 relative to operation of the characteristic circuit 532. As with other example, unit 540 may be configured to communicate an indication of the predictive maintenance alert to another circuit, such as an ECU, a system-level microprocessor or any external system-level circuit. Based on the predictive maintenance alert, a larger system may schedule, suggest, or require maintenance on safety mechanism 504.

In some examples, a characteristic circuit 532, a characteristic circuit replica 536 that operates under enhanced stress conditions from stress generator 538, and an end-of-life check and warning generation unit 540 may be implemented with safety mechanism 504, without implementing characteristic circuit 512, characteristic circuit replica 516, stress generator 518, and an end-of life check and warning generation unit 520 for functional element 502. Also, referring again to FIG. 3, in some examples, a characteristic circuit, a characteristic circuit replica that operates under enhanced stress conditions from a stress generator, and an end-of life check and warning generation unit may be implemented for each of first functional element 302 and second functional element 304.

Figure 6:
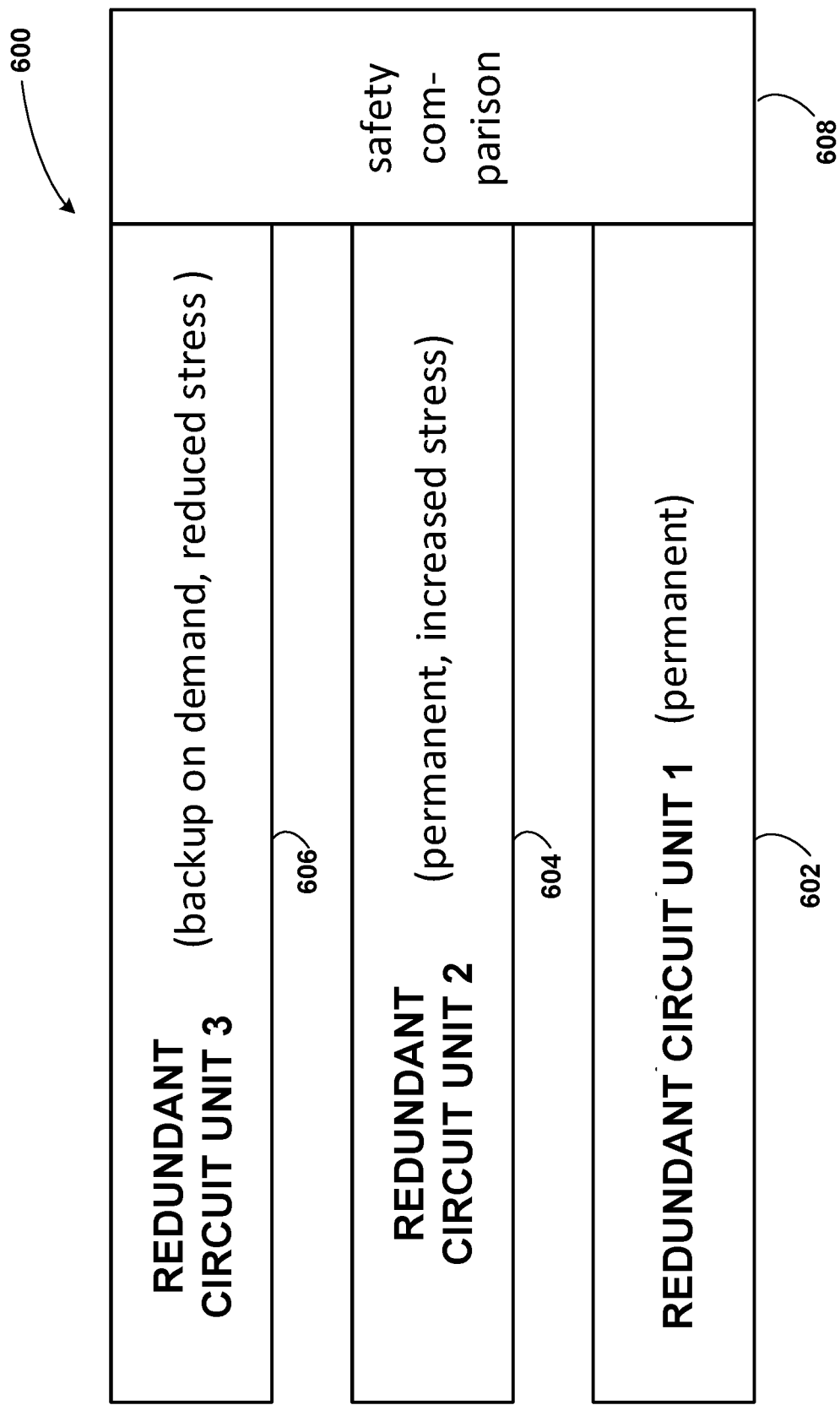
FIG. 6 is another block diagram showing a circuit according to an example of this disclosure.

FIG. 6 is another block diagram showing a circuit 600 according to an example of this disclosure. Circuit 600 may comprise a first circuit unit 602 configured to perform a circuit function under normal operating conditions, a second circuit unit 603 that is structurally similar to first circuit unit 602, wherein the second circuit unit 604 is configured to perform the circuit function under enhanced stress conditions, and a third circuit unit that is structurally similar to the first circuit unit 602 and the second circuit unit 604, wherein the third circuit unit 606 is configured to perform the circuit function under normal or reduced stress conditions. In other words, first circuit unit 602, second circuit unit 604, and third circuit unit 606 may be redundant functional circuits. First and second circuit units 602 and 604 may be permanent circuit elements configured to be operated redundantly in normal operation of circuit 600. First circuit unit 602 may operate under normal stress conditions whereas second circuit unit 604 may operate under enhanced stress conditions. A stress generator (similar to those described above) may be associated with second circuit unit 604 and configured to create the enhanced stress conditions. Third circuit unit 606 may comprise a back-up circuit unit that is activated when a problem is identified with first circuit unit 602 or second circuit unit. Third circuit element 606 may operate under reduced stress conditions (e.g., a reduced supply voltage) relative to operation of first and second circuit units 602 and 604. Alternatively, in some examples, third circuit element 606 may operate under normal stress conditions that are similar to those experienced by first circuit element 602. Indeed, there can be situations where reduced stress conditions are not possible (such as when the circuit is operating near its technological limits), in which case, third circuit element 606 may operate under normal stress conditions that are similar to those experienced by first circuit element 602

Safety comparison unit 608 may comprise a mechanism configured to promote safety associated with operation of redundant circuit units 602, 604, 606 within a larger system, such as an automobile or other vehicle. Safety mechanism unit 608, for example, may be configured monitor output of active ones of redundant circuit units 602, 604, 606 or one or more operational parameters of active ones of redundant circuit units 602, 604, 606.

In response to identifying a possible functional safety issue, in normal operation of first and second circuit units 602 and 604, safety comparison unit 608 may be configured to generate one or more safety signals, issue an alert, or cause remedial action, such as disabling one or more components of a larger system, disabling first and second circuit units 602 or 604, or other remedial action that promotes safety. In some examples, comparison unit 608 is configured to output a safety alert in response to identifying an undesirable operation of first or second circuit units 602, 604. In some examples, comparison unit 608 is configured is configured to disable at least a portion of circuit 600 in response to identifying an undesirable operation of either first or second circuit units 602 or 604.

In some examples, redundant circuit units 602, 604, and 606 can each be viewed as being similar to main function unit 100 of FIG. 1, which is described in detail above. For example, redundant circuit units 602, 604, and 606 may each comprise a driver circuit, a logic circuit, a motor driver, a sensor, an oscillator circuit, a level shifter circuit, a phase shift circuit, a phase locked loop circuit, an ADC circuit, a DAC circuit, an ALU, a processor, a microcontroller, a DSP, a communication interface circuit such as an SPI or another type of communication interface circuit, a digital logic circuit, a state machine, a signal processing circuit, a control circuit, an analog function circuit, a memory circuit, or any other circuit configured to perform one or more circuit functions.

In some examples, circuit units 602, 604, which are operated under different stress conditions may be structurally identical in order to make their results as comparable as possible for a good end of live diagnostic. Moreover, circuit unit 606, in some examples, which operates under normal or reduced stress, may comprise a diverse implementation relative to circuit units 602, 604 in order to provide additional safety against systematic faults.

In some examples, comparison unit 608 is configured to compare output of first circuit unit 602 relative to output of second circuit unit 604 and issue a predictive maintenance alert for circuit 600 in response to the output of first circuit unit 602 being substantially different than output of second circuit unit 604. In some examples, circuit 600 is configured to deactivate third circuit unit 606 when outputs of the first circuit unit 602 and second circuit unit 604 are substantially similar and to activate third circuit unit 606 when outputs of first circuit unit 602 and second circuit unit 604 are substantially different. For example, in response to outputs of first and second circuit units 602, 604 being substantially different (e.g., as determined by safety comparison unit 608), circuit 600 may be configured to deactivate one of first and second circuit units 602, 604. In this case, a particular one of first and second circuit units 602, 604 that remains active may be the particular one of first and second circuit units 602, 604 that exhibits output that most closely matches output of third circuit unit 606. In most cases, the deactivated circuit unit may comprise second circuit unit 604, since second circuit unit 604 is configured to experience enhanced stress conditions relative to first circuit unit 602.

As noted, a stress generator (similar to those described above) may be associated with second circuit unit 604 and configured to create the enhanced stress conditions for second circuit unit 604 relative to the normal operating conditions of first circuit unit 602. The enhanced stress conditions, for example, may comprise a higher temperature than the normal operating conditions, an increased supply voltage relative to a normal supply voltage associated with the normal operating conditions, an increased load relative to a normal load associated with the normal operating conditions, other stress conditions, or combinations of these enhanced stress conditions.

With circuit 600, first circuit unit 602 may operate under normal operation conditions, and second circuit unit 604 may operate under the enhanced stress conditions, which may accelerate aging in second circuit unit 604 relative to aging experienced by first circuit unit 602. In some examples, third circuit unit 606 is deactivated as long safety comparison unit 608 determines that the comparison of one or more parameters of first circuit unit 602 to one or more parameters of second circuit unit 604 is acceptable. Moreover, since third circuit unit 606 may be deactivated in many situations, and since third circuit unit 606, when activated, may experience reduced stress than that of first circuit unit 602 and second circuit unit 604, third circuit unit 606 may have shower aging that that experienced by first circuit unit 602 and second circuit unit 604.

In some examples, once safety comparison unit 608 determines that one or more parameters (e.g., measured circuit values or outputs) of first circuit unit 602 and second circuit unit 604 are in disagreement (or disagreement over some threshold), safety comparison unit 608 may output a predictive maintenance alert, in order to recommend maintenance on circuit 600. In this case, one of first circuit unit 602 and second circuit unit 604 may have failed, and the remaining functional of both units may be close to an end of life. Moreover, in this case, circuit 600 may activate third circuit unit 606 and compare its circuit parameters or output to those of first circuit unit 602 and second circuit unit 604. The one of first circuit unit 602 and second circuit unit 604 which is better matched with third circuit unit 606 may remain active and the other may be disabled (usually the unit that remains active should be first circuit element 602 due to accelerated aging of second circuit element 604). However, if second circuit element 604 is better matched with third circuit unit 606, then second circuit unit 604 may remain active (and first circuit unit 602 may be disabled), and in this case, the increased stress applied to second circuit unit 604 may be reduced to normal stress. Moreover, in this case, the urgency of the maintenance request may be enhanced urgency since second circuit unit 604 has a shorter expected life span than first circuit unit 602 (due to the enhanced stress second circuit unit 604 experienced).

Figure 7:
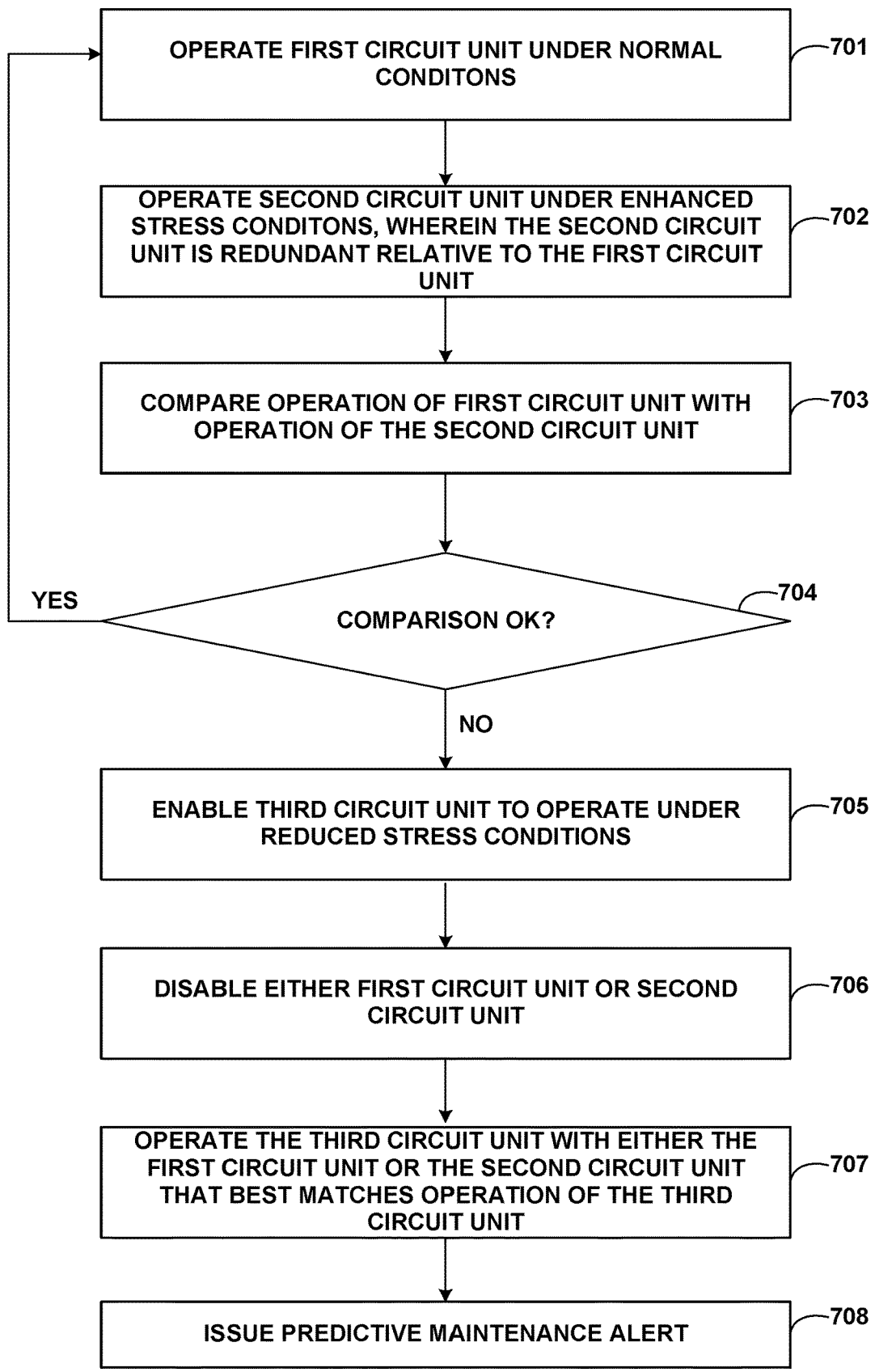
FIG. 7 is another flow diagram showing operation of a circuit according to an example of this disclosure.

FIG. 7 is another flow diagram showing operation of a circuit 600 according to an example of this disclosure. As shown in FIG. 7, circuit 600 operates first circuit unit 602 under normal conditions, and circuit 600 operates second circuit unit 604 under enhanced stress conditions (702). In this example, first circuit unit 602 and second circuit unit 604 are redundant circuit units that perform redundant circuit functions.

Safety comparison unit 608 compares operation of first circuit unit 602 with operation of second circuit unit 604 (703). If the comparison is not OK (no branch of 704), e.g., due to different outputs or different measured circuit parameter values that are not within a threshold range of one another, circuit 600 may enable third circuit unit 606 to operate under reduced stress conditions (705). Moreover, circuit 600 may disable one of first circuit unit 602 and second circuit unit 604 (706), i.e., disable that circuit unit which does not match operation of third circuit unit 606. In this case, circuit 600 operates third circuit unit 606 wither either first circuit unit 602 or second circuit unit 604 that best matches operation of third circuit unit 606. Safety comparison unit 608, may issue a predictive maintenance alert 600, prior to circuit exhibiting failure in by both first circuit unit 602 and second circuit unit 604.

In still other examples, it may be desirable to operate two different characteristic replica circuits (e.g., second circuit unit 604 and third circuit unit 606) under different stress conditions relative to one another. This may be desirable if the characteristic replica is small and does not significantly increase the chip cost.

According to one or more examples described herein, in order to achieve an integrated circuit with integrated safety monitoring features according to this disclosure, in some examples, circuits of this disclosure (e.g., circuit 10, circuit 300, circuit 400 circuit 500, or circuit 600) may be housed within a molding compound. In other words, in some examples, the elements of circuit 10, circuit 300, circuit 400, circuit 500, or circuit 600 may all reside within a molding compound of a circuit package.

Alternatively, in some examples, various components or circuits 10, 300, 400, 500, or 600 may be assembled from smaller components to form the circuits. Again, however, by implementing all of the components of circuit 10, circuit 300, circuit 400, circuit 500, or circuit 600 within a molding compound of a circuit package, a self-contained functional circuit with integrated safety monitoring functionality can be achieved.

The following numbered clauses demonstrate one or more aspects of the disclosure.

Clause 1—A circuit comprising: a main function unit configured to perform a circuit function; a characteristic circuit that comprises at least a portion of the main function unit, wherein the characteristic circuit is configured to operate under normal operating conditions; a characteristic circuit replica that comprises a replica of the characteristic circuit, wherein the characteristic circuit replica is configured to operate under enhanced stress conditions; and an evaluation unit, wherein the evaluation unit is configured to evaluate operation of the characteristic circuit replica relative to operation of the characteristic circuit.

Clause 2—The circuit of clause 1, wherein the evaluation unit is configured to issue a predictive maintenance alert to identify a potential future problem with main function unit based on the evaluation of operation of the characteristic circuit replica relative to operation of the characteristic circuit.

Clause 3—The circuit of clause 2, further comprising a communication unit, wherein the communication unit is configured to communicate an indication of the predictive maintenance alert to another circuit.

Clause 4—The circuit of any of clauses 1-3, wherein the enhanced stress conditions comprise a higher temperature than the normal operating conditions.

Clause 5—The circuit of clause 4, further comprising a local heater positioned relative to the characteristic circuit replica and configured to generate the higher temperature.

Clause 6—The circuit any of clauses 1-5, wherein the enhanced stress conditions comprise an increased supply voltage relative to a normal supply voltage associated with the normal operating conditions.

Clause 7—The circuit of any of clauses 1-6, wherein the enhanced stress conditions comprise a higher temperature than the normal operating conditions an increased supply voltage relative to a normal supply voltage associated with the normal operating conditions.

Clause 8—The circuit of any of clauses 1-7, wherein the enhanced stress conditions comprise an increased load relative to a normal load associated with the normal operating conditions.

Clause 9—The circuit of any of clauses 1-8, wherein the main function unit comprises a first main function unit, the circuit further comprising: a second main function unit that is configured to operate similar to the first main function unit; and a safety comparison unit that is configured to compare operation of the first main function unit and the second main function unit.

Clause 10—The circuit of any of clause 9, wherein the safety comparison unit that is configured to issue a safety alert in response to the first main function unit operating differently than the second main function unit.

Clause 11—The circuit of clause 9 or 10, wherein the safety comparison unit that is configured to disable at least a portion of the circuit in response to the first main function unit operating differently than the second main function unit.

Clause 12—The circuit of any of clauses 1-11, the circuit further comprising a safety mechanism unit that is configured monitor output of the main function unit.

Clause 13—The circuit of clause 12, wherein the safety mechanism unit is configured to output a safety alert in response to identifying an undesirable operation of the main function unit.

Clause 14—The circuit of clause 12 or 13, wherein the safety mechanism unit is configured to disable at least a portion of the circuit in response to identifying an undesirable operation of the main function unit.

Clause 15—The circuit of any of clauses 1-14, wherein main function unit comprises one or more circuit units selected from a group consisting of: a load driver circuit; a logic circuit; a motor driver; an oscillator circuit; a level shifter circuit; a phase shift circuit; a phase locked loop circuit; an analog-to-digital converter circuit; a digital-to-analog converter circuit; an ALU; a processor; a microcontroller; a DSP; a communication interface circuit; a digital logic circuit; a state machine; a signal processing circuit; a control circuit; an analog function circuit; a sensor; or a memory circuit.

Clause 16—The circuit of any of clauses 1-15, the circuit further comprising a stress generator configured to create one or more of the enhanced stress conditions for the characteristic circuit replica.

Clause 17—A circuit comprising: a first circuit unit configured to perform a circuit function under normal operating conditions; a second circuit unit that is structurally similar to the first circuit unit, wherein the second circuit unit is configured to perform the circuit function under enhanced stress conditions; and a third circuit unit that is structurally similar to the first and second circuit units, wherein the third circuit unit is configured to perform the circuit function under reduced stress conditions.

Clause 18—The circuit of clause 17, further comprising a comparison unit, wherein the comparison unit is configured to compare output of the first circuit unit relative to output of the second circuit unit and issue a predictive maintenance alert in response to the output of the first circuit unit being substantially different than output of the second circuit unit.

Clause 19—The circuit of clause 17 or 18, wherein the circuit is configured to deactivate the third circuit unit when outputs of the first and second circuit units are substantially similar and activate the third circuit unit when outputs of the first and second circuit units are substantially different.

Clause 20—The circuit of clause 19, wherein, in response to outputs of the first and second circuit units being substantially different, the circuit is configured to deactivate one of the first and second circuit units, and wherein a particular one of the first and second circuit units that remains active is the particular one of the first and second circuit units that exhibits output that most closely matches output of the third circuit unit.

Clause 21—The circuit of any of clauses 17-20, wherein main function unit comprises one or more circuit units selected from a group consisting of: a load driver circuit; a logic circuit; a motor driver; an oscillator circuit; a level shifter circuit; a phase shift circuit; a phase locked loop circuit; an analog-to-digital converter circuit; a digital-to-analog converter circuit; an ALU; a processor; a microcontroller; a DSP; a communication interface circuit; a digital logic circuit; a state machine; a signal processing circuit; a control circuit; an analog function circuit; a sensor; or a memory circuit.

Clause 22—The circuit of any of clauses 17-21, the circuit further comprising a stress generator configured to create the enhanced stress conditions, wherein the enhanced stress conditions comprise one or more conditions selected from a group consisting of: a higher temperature than the normal operating conditions; an increased supply voltage relative to a normal supply voltage associated with the normal operating conditions; or an increased load relative to a normal load associated with the normal operating conditions.

Clause 23—A method of operating a circuit, the method comprising: performing a circuit function under normal operating conditions, wherein performing the circuit function under the normal operating conditions includes performing at least a portion of the circuit functions via a characteristic circuit; performing at least the portion of the circuit function under enhanced stress conditions via a characteristic circuit replica; and predicting a potential future problem with the circuit function under the normal conditions based on an evaluation of operation of the characteristic circuit relative to operation of the characteristic circuit replica.

Various examples of the disclosure have been described. Any combination of the described systems, operations, or functions is contemplated. These and other examples are within the scope of the following claims.

What is claimed is:

1. A circuit comprising:
   a main function unit configured to perform a circuit function;
   a characteristic circuit that comprises at least a portion of the main function unit, wherein the characteristic circuit is configured to operate under first operating conditions;
   a characteristic circuit replica that comprises a replica of the characteristic circuit, wherein the characteristic circuit replica is configured to operate under second operating conditions, wherein the second operating conditions comprise enhanced stress conditions relative to the first operating conditions; and
   an evaluation unit, wherein the evaluation unit is configured to evaluate operation of the characteristic circuit replica relative to operation of the characteristic circuit and wherein the evaluation unit is configured to issue a predictive maintenance alert to identify a potential future problem with main function unit based on the evaluation of operation of the characteristic circuit replica relative to operation of the characteristic circuit.

2. The circuit of claim 1, further comprising a communication unit, wherein the communication unit is configured to communicate an indication of the predictive maintenance alert to another circuit.

3. The circuit of claim 1, wherein the second operating conditions comprise a higher temperature than the first operating conditions.

4. The circuit of claim 3, further comprising a local heater positioned relative to the characteristic circuit replica and configured to generate the higher temperature.

5. The circuit of claim 1, wherein the second operating conditions comprise an increased supply voltage relative to a supply voltage associated with the first operating conditions.

6. The circuit of claim 1, wherein the second operating conditions comprise a higher temperature than the first operating conditions and an increased supply voltage relative to a supply voltage associated with the first operating conditions.

7. The circuit of claim 1, wherein the second operating conditions comprise an increased load relative to a load associated with the first operating conditions.

8. The circuit of claim 1, wherein the main function unit comprises a first main function unit, the circuit further comprising:
   a second main function unit that is configured to operate similar to the first main function unit; and
   a safety comparison unit that is configured to compare operation of the first main function unit and the second main function unit.

9. The circuit of claim 8, wherein the safety comparison unit that is configured to issue a safety alert in response to the first main function unit operating differently than the second main function unit.

10. The circuit of claim 8, wherein the safety comparison unit is configured to disable at least a portion of the circuit in response to the first main function unit operating differently than the second main function unit.

11. The circuit of claim 1, the circuit further comprising a safety mechanism unit that is configured to monitor output of the main function unit.

12. The circuit of claim 11, wherein the safety mechanism unit is configured to output a safety alert in response to identifying an undesirable operation of the main function unit.

13. The circuit of claim 11, wherein the safety mechanism unit is configured to disable at least a portion of the circuit in response to identifying an undesirable operation of the main function unit.

14. The circuit of claim 1, wherein main function unit comprises one or more circuit units selected from a group consisting of:
   a load driver circuit;
   a logic circuit;
   a motor driver;
   an oscillator circuit;
   a level shifter circuit;
   a phase shift circuit;
   a phase locked loop circuit;
   an analog-to-digital converter circuit;
   a digital-to-analog converter circuit;
   an arithmetic logic unit (ALU);
   a processor;
   a microcontroller;
   a digital signal processor (DSP);
   a communication interface circuit;
   a digital logic circuit;
   a state machine;
   a signal processing circuit;
   a control circuit;
   an analog function circuit;
   a sensor; or
   a memory circuit.

15. The circuit of claim 1, the circuit further comprising a stress generator configured to create one or more of the enhanced stress conditions of the second operating conditions.

16. A circuit comprising:
a first circuit unit configured to perform a circuit function under first operating conditions;
a second circuit unit that is structurally similar to the first circuit unit, wherein the second circuit unit is configured to perform the circuit function under second operating conditions, wherein the second operating conditions comprise enhanced stress conditions relative to the first operating conditions;
a third circuit unit that is structurally similar to the first and second circuit units, wherein the third circuit unit is configured to perform the circuit function under third operating conditions, wherein the third operating conditions comprise reduced stress conditions relative to the first operating conditions; and
a comparison unit, wherein the comparison unit is configured to compare an output of the first circuit unit relative to an output of the second circuit unit and issue a predictive maintenance alert in response to the output of the first circuit unit being substantially different than the output of the second circuit unit.

17. The circuit of claim 16, wherein the circuit is configured to deactivate the third circuit unit when outputs of the first and second circuit units are substantially similar and activate the third circuit unit when outputs of the first and second circuit units are substantially different.

18. The circuit of claim 17, wherein,
in response to outputs of the first and second circuit units being substantially different, the circuit is configured to deactivate one of the first and second circuit units, and
wherein a particular one of the first and second circuit units that remains active is the particular one of the first and second circuit units that exhibits output that most closely matches output of the third circuit unit.

19. The circuit of claim 16, wherein first circuit unit, the second circuit unit, and third circuit unit each comprise one or more circuit units selected from a group consisting of:
a load driver circuit;
a logic circuit;
a motor driver;
an oscillator circuit;
a level shifter circuit;
a phase shift circuit;
a phase locked loop circuit;
an analog-to-digital converter circuit;
a digital-to-analog converter circuit;
an arithmetic logic unit (ALU);
a processor;
a microcontroller;
a digital signal processor (DSP);
a communication interface circuit;
a digital logic circuit;
a state machine;
a signal processing circuit;
a control circuit;
an analog function circuit;
a sensor; or
a memory circuit.

20. The circuit of claim 16, the circuit further comprising a stress generator configured to create the enhanced stress conditions, wherein the enhanced stress conditions comprise one or more conditions selected from a group consisting of:
a higher temperature than the first operating conditions;
an increased supply voltage relative to a supply voltage associated with the first operating conditions; or
an increased load relative to a load associated with the first operating conditions.

21. A method of operating a circuit, the method comprising:
performing a circuit function under first operating conditions, wherein performing the circuit function under the first operating conditions includes performing at least a portion of the circuit functions via a characteristic circuit;
performing, via a characteristic circuit replica, at least the portion of the circuit function under second operating conditions, wherein the second operating conditions comprise enhanced stress conditions relative to the first operating conditions;
predicting a potential future problem with the circuit function under the first operating conditions based on an evaluation of operation of the characteristic circuit relative to operation of the characteristic circuit replica; and
outputting a predictive maintenance alert to identify the potential future problem with the circuit function in response to predicting the potential future problem.

* * * * *